(12) United States Patent
Furihata et al.

(10) Patent No.: US 7,495,927 B2
(45) Date of Patent: Feb. 24, 2009

(54) MOUNT STRUCTURE, ELECTRO-OPTICAL DEVICE, AND ELECTRONIC APPARATUS

(75) Inventors: Hiroaki Furihata, Matsumoto (JP); Hiroyuki Onodera, Matsumoto (JP)

(73) Assignee: Epson Imaging Devices Corporation, Azumino-shi (JP)

( * ) Notice: Subject to any disclaimer, the term of this patent is extended or adjusted under 35 U.S.C. 154(b) by 0 days.

(21) Appl. No.: 11/956,478

(22) Filed: Dec. 14, 2007

(65) Prior Publication Data

US 2008/0174979 A1 Jul. 24, 2008

(30) Foreign Application Priority Data

Jan. 24, 2007 (JP) ............... 2007-013847

(51) Int. Cl.
*H05K 7/00* (2006.01)

(52) U.S. Cl. ............ 361/760; 361/777; 361/807; 361/808; 361/809; 361/810; 361/767; 361/769

(58) Field of Classification Search ........... 361/777, 361/807, 808, 809, 810, 803, 760, 767, 768, 361/769; 174/255, 260, 261, 263, 250, 264; 257/778, 737, 738, 678, 780, 751, 761–765
See application file for complete search history.

(56) References Cited

U.S. PATENT DOCUMENTS

| | | | | |
|---|---|---|---|---|
| 4,963,002 A | * | 10/1990 | Tagusa et al. ............... | 349/149 |
| 5,822,191 A | * | 10/1998 | Tagusa et al. ............... | 361/751 |
| 5,847,936 A | * | 12/1998 | Forehand et al. ............ | 361/794 |
| 5,917,156 A | * | 6/1999 | Nobori et al. ............... | 174/250 |
| 6,313,999 B1 | * | 11/2001 | Fratti et al. ................. | 361/774 |
| 6,400,576 B1 | * | 6/2002 | Davidson .................... | 361/763 |
| 6,835,274 B2 | * | 12/2004 | Honda et al. ................ | 156/313 |
| 7,202,421 B2 | * | 4/2007 | Sugiura ...................... | 174/267 |
| 2002/0012234 A1 | * | 1/2002 | Harada et al. ............... | 361/778 |
| 2004/0120127 A1 | * | 6/2004 | Hirose ........................ | 361/760 |
| 2007/0108627 A1 | * | 5/2007 | Kozaka et al. .............. | 257/778 |
| 2007/0119618 A1 | * | 5/2007 | Nishitani et al. ............ | 174/260 |
| 2008/0135283 A1 | * | 6/2008 | Hibino et al. ............... | 174/260 |

FOREIGN PATENT DOCUMENTS

JP 2005-353983 A 12/2005

* cited by examiner

*Primary Examiner*—Jeremy C Norris
*Assistant Examiner*—Hoa C Nguyen
(74) *Attorney, Agent, or Firm*—Lowe Hauptman Ham & Berner, LLP (57) ABSTRACT

A mounting structure includes a base member and an electronic component having a protruded electrode which is formed on a transparent substrate. The electrode includes pads and elastic projections that are covered with a conductive film. On the transparent substrate, terminals connected to the conductive film are formed. Dummy projections are provided on the surface of the base member. When mounting the electronic component, the electrodes are deformed by the pressure for the mounting. The dummy projections formed on the base member are also deformed. A pattern, for visually inspecting the deformation volume of dummy projections, is marked on the transparent substrate.

11 Claims, 7 Drawing Sheets

MOUNT STRUCTURE, ELECTRO-OPTICAL DEVICE, AND ELECTRONIC APPARATUS

RELATED APPLICATIONS

The present application is based on, and claims priority from, Japan Application Number 2007-013487, filed Jan. 24, 2007, the disclosure of which is hereby incorporated by reference herein in its entirety.

BACKGROUND

1. Technical Field

The present invention relates to a mount structure that is formed by mounting an electronic component on a substrate. The present invention further relates to an electro-optical device that adopts the configuration of such a mount structure, and an electronic apparatus that is provided with such an electro-optical device.

2. Related Art

As a typical configuration of a mount structure that is known in the technical field to which the present invention pertains, an electronic component such as an IC is mounted on a substrate by means of a chip-on-glass (hereafter abbreviated as "COG") method or the like with an anisotropic conductive film (hereafter abbreviated as "ACF") being interposed therebetween. In the formation of such a mount structure, an ACF having resinous particles and an electro-conductive film (i.e., metal plating layer) that coats the resinous particles is commonly used in the related art. When manufacturing a liquid crystal device, which is an example of an electro-optical device that has the common/popular mount structure described above, an electronic component for driving liquid crystal elements (e.g., driver IC) is mounted on a substrate with an ACF interposed therebetween. The COG method or a similar method is used for the mounting of the electronic component thereon.

In the configuration of such a mount structure, the input/output terminals (i.e., bumps) of the driver IC are electrically connected to source electrodes to which data signals are supplied, gate electrodes to which scanning signals are supplied, and external connection electrodes, respectively, which are formed on the substrate. Specifically, the input/output terminals of the driver IC are electrically connected thereto via electrically conductive particles that are provided in a random layout in an ACF adhesive. As described above, electro-conductive particles contained in an ACF play an important role in electrically connecting the terminals of an electronic component and various kinds of electrodes.

These days, there is a growing demand for a liquid crystal device that is capable of offering high-definition image display. As the market demands for the higher definition of display, the pitch of the terminals of an electronic component is becoming narrower and narrower. The same holds true for electrodes formed on a substrate. Because of the narrowed pitch of the terminals/electrodes, the electric connection method of the related art that uses an ACF has a disadvantage in that a short circuit failure could occur between adjacent terminals or adjacent electrodes via electro-conductive particles contained in the ACF.

In order to provide a technical solution to the problem of such a short circuit failure, JP-A-2005-353983 proposes an alternative electric connection method that does not use any ACF at all.

In the proposed electric connection method, each terminal of an electronic component is made up of an electrode pad, a resinous projection having elasticity, and an electro-conductive film that covers a part of the surface of the electrode pad to extend across (i.e., further cover) the surface of the resinous projection. Having such a configuration, the electronic component disclosed in the above-identified patent publication is adhered to a substrate by means of an ordinary non-special adhesive with each of the electro-conductive films being directly connected to the corresponding one of various kinds of electrodes.

Since the proposed configuration does not employ any electro-conductive particles, it is possible to prevent adjacent terminals or adjacent electrodes from being short-circuited with each other. As another advantage, even when the bonding strength of the adhesive decrease due to aging, that is, with the passage of time, after mounting of the electronic component on the substrate, the resinous projection gets elastically deformed in counteraction to the decrease in the adhesive strength; and therefore, thanks to the resilience force thereof, there rarely occurs an electric connection failure between the electro-conductive film and the electrode. As still another advantage, the cost of production is reduced because electro-conductive particles are not used. As explained above, the proposed electric connection method offers various advantages over the conventional electric connection method that uses ACFs.

In the electric connection method described in the above-identified patent publication, it is possible to make a judgment as to whether the electric connection between a certain terminal of an electronic component and the corresponding electrode is in a good condition or in a poor condition on the basis of amount of deformation of the terminal caused at the time when the electronic component is non-tentatively mounted on a substrate. Specifically, it is possible to judge that the electric connection between a certain terminal of an electronic component and the corresponding electrode is in a good condition if the terminal is elastically deformed by a predetermined deformation amount, where a sufficient degree of deformation thereof means that the contact area between the electro-conductive film of the terminal and the electrode is not insufficiently small. However, it is practically difficult to visually perceive the amount of deformation of a terminal after the non-tentative mounting of an electronic component on a substrate because the terminal is arrayed at a position that overlaps the corresponding electrode when viewed in two dimensions (i.e., in plan view). That is, the proposed electric connection method has not addressed the problem of practical difficulty in visually checking whether the electric connection between a certain terminal of an electronic component and the corresponding electrode is in a good condition or in a poor condition.

In the ACF-based electrical connection method used in the related art that is described before the above alternative proposed method, a judgment as to whether the electric connection between a certain terminal of an electronic component and the corresponding electrode is in a good condition or in a poor condition is made as follows. After the non-tentative mounting of an electronic component on a substrate that has transparency, each shape of deformation of several test-target ACFs, which are selected among a plurality of ACFs placed in a random layout in the mounting area of the electronic component, is visually observed through the transparent substrate. Then, each shape of deformation of the visually-checked target ACFs is indirectly compared with more than one specified shapes of deformation thereof that have been stored and registered in, for example, a personal computer or the like in advance as sample deformation shapes. The plural shapes of deformation thereof are pre-defined in the personal computer or the like so as to enable rank classification for the check target ACF (e.g., a good deformation shape, a poor deformation shape, and the like) in a comparative manner. This is how the judgment is made in the first-mentioned electrical connection method that uses ACFs. According to such an electric connection condition check method, it is not possible to visually observe the state of electric connection therebetween by means of a mount structure only in an easy manner.

SUMMARY

An advantage of some aspects of the invention is to provide a novel and inventive mount structure that makes it easier to visually check the condition of electric connection between terminals of an electronic component and the corresponding electrodes after the mounting of the electronic component on a substrate, thereby improving the electric connection method disclosed in the above-identified patent publication. Advantageously, the invention further provides an electro-optical device that adopts the configuration of such a mount structure, and an electronic apparatus that is provided with such an electro-optical device.

In order to address the above-identified problem without any limitation thereto, the invention provides, as a first aspect thereof, a mount structure including: an electronic component having a base substance and protruded electrodes provided on a surface of the base substance, each of the protruded electrodes having an electrode pad, a projection having elasticity, and an electro-conductive film that is formed to extend from a surface of the electrode pad to go over a surface of the projection; a transparent substrate for mounting the electronic component thereon, the transparent substrate having terminals that are electrically connected to the electro-conductive films; at least one dummy projections each of which is provided on the surface of the base substance; and at least one patterns each of which is formed at a position corresponding to the dummy projection on a surface of the transparent substrate, wherein each of the dummy projections becomes elastically deformed by a certain deformation amount when the electronic component is mounted on the transparent substrate, the deformation amount thereof having a certain predetermined deformation ratio relative to the amount of deformation of each of the protruded electrodes, which also becomes elastically deformed due to pressure applied by the electronic component onto the surface of the transparent substrate; and each of the patterns is used for checking the amount of elastic deformation of the corresponding dummy projection when making observation through a reverse face of the transparent substrate that is opposite the above-mentioned surface thereof.

The mount structure according to the first aspect of the invention described above has, as its non-limiting constituent elements, an electronic component having a base substance and protruded electrodes provided on a surface of the base substance, and a transparent substrate onto which the electronic component is mounted. In a preferred example, the transparent substrate should be made of a transparent material such as glass, quartz, or the like. Each of the protruded electrodes has an electrode pad that is electrically conductive, a projection having elasticity, and an electro-conductive film that is formed to extend from a surface of the electrode pad to go over a surface of the projection. In a preferred example, the projection should be made of a resin material having elasticity. The transparent substrate has terminals that are electrically connected to the electro-conductive films.

In particular, the mount structure according to the first aspect of the invention described above has, as its non-limiting constituent elements, at least one dummy projections each of which is provided on the surface of the base substance and at least one patterns each of which is formed at a position corresponding to the dummy projection on a surface of the transparent substrate, where, in such a configuration, each of the dummy projections becomes elastically deformed by a certain deformation amount when the electronic component is mounted on the transparent substrate, the deformation amount thereof having a certain predetermined deformation ratio relative to the amount of deformation of each of the protruded electrodes, which also becomes elastically deformed due to pressure applied by the electronic component onto the surface of the transparent substrate; and each of the patterns is used for checking the amount of elastic deformation of the corresponding dummy projection when making observation through a reverse face of the transparent substrate that is opposite the above-mentioned surface thereof. Herein, the predetermined deformation ratio may be set in the following range: the deformation amount of the protruded electrodes to the deformation amount of the dummy projections=1-9:9-1. In a preferred example, each of the dummy projections is not electrically conductive with the corresponding pattern. In addition, it is preferable that each of the dummy projections should have a projection having elasticity and an electro-conductive film that goes over, at least, a surface of the projection.

With such a configuration, after the non-tentative mounting of the electronic component on the transparent substrate, it is possible to visually observe the positional relationship (i.e., makes a visual comparison) between each of the elastically-deformed dummy projections and the corresponding one of the patterns when each of the patterns and the corresponding dummy projection are viewed through a reverse face of the transparent substrate that is opposite the above-mentioned surface thereof. By this means, it is possible to check the amount of deformation of each of the dummy projections. Then, on the basis of the deformation amount of each of the dummy projections, it is possible to indirectly check (i.e., estimate) the deformation amount of each of the protruded electrodes. Consequently, the invention makes it possible to indirectly check (estimate) whether the electric connection between each of the protruded electrodes and the corresponding one of the terminals is in a good condition or not. If it is judged that the deformation amount of a certain protruded electrode(s) is not in an acceptable level, it means that there is a high possibility of a contact/connection failure between the above-mentioned certain protruded electrode(s) and the corresponding one(s) of the terminals. In such a case, the electronic component is removed from the transparent substrate so as to redo the non-tentative mounting of the electronic component. By this means, it is possible to enhance the rework-ability of the electronic component.

In a preferred example, each of the dummy projections should have the same shape as that of the corresponding protruded electrode(s). For example, it is preferable that each of the dummy projections should have the shape of a hemisphere, that is, the same shape as that of the corresponding protruded electrode(s). The reason why each of the dummy projections should, preferably, have the same shape as that of each of the protruded electrodes is that it becomes easier to indirectly check/estimate the amount of elastic deformation of the deformed electrodes after the mounting of the electronic component on the substrate because, if so configured, the amount of elastic deformation of the deformed electrodes is substantially the same as the amount of elastic deformation of the deformed dummy projections, which means that it becomes easier to indirectly check/estimate whether the electric connection between each of the protruded electrodes and the corresponding one of the terminals is in a good condition or not.

In a preferred example, in order to simplify the manufacturing process thereof, each of the patterns should be made of the same electrically conductive material as that of each of the terminals. In addition, in order to simplify the manufacturing process thereof, it is preferable that each of the projections of the dummy projections should be made of the same material as that of each of the projections of the protruded electrodes. Further in addition, in order to simplify the manufacturing process thereof, it is preferable that each of the electro-conductive films of the dummy projections is made of the same material as that of each of the electro-conductive films of the protruded electrodes.

In the configuration of the mount structure according to the first aspect of the invention described above, it is preferable that the base substance of the electronic component has the shape of a substantially rectangular parallelepiped; the protruded electrodes are arrayed along each of two sides that are opposed to each other on the surface of the base substance; and the dummy projections are provided at positions close to the protruded electrodes that are arrayed in at least one line along each of the above-mentioned two sides that are opposed to each other on the surface of the base substance, the dummy projections being provided in the proximity of both of the ends and the center of each of the above-mentioned two sides.

With such a configuration, the invention makes it possible to check whether or not the electronic component is non-tentatively mounted substantially on the entire surface of the transparent substrate in a uniform manner. In other words, the deformation amount check method described above makes it possible to indirectly check (estimate) whether the deformation amount of each of substantially all of the protruded electrodes of the electronic component is in an acceptable level or not by visually observing the deformation amount of each of the dummy projections. Consequently, the invention makes it possible to indirectly check (estimate) whether the electric connection between each of substantially all of the protruded electrodes and the corresponding one of the terminals is in a good condition or not.

In the configuration of the mount structure according to the first aspect of the invention described above, it is preferable that each of the dummy projections and each of the protruded electrodes has the shape of a hemisphere; each of the patterns is made up of the plurality of concentric ring-shaped sub-patterns; each of the ring-shaped sub-patterns functions as a deformation amount check mark that can be used for checking the amount of deformation of the corresponding dummy projection; and when each of the patterns and the corresponding dummy projection are viewed from the reverse face of the transparent substrate, the positional relationship between the ring-shaped sub-patterns and the external circumferential form of the corresponding dummy projection that has been elastically deformed at the time of the mounting of the electronic component on the transparent substrate is observed, whereby making it possible to check the amount of deformation of each of the dummy projections.

With such a configuration, since each of the dummy projections as well as each of the protruded electrodes has the shape of a hemisphere, each of them is elastically deformed into a circular shape in a plan view as a result of the mounting of the electronic component on the transparent substrate. Therefore, the invention makes it possible to check the amount of deformation of each of the dummy projections in an easy manner while using each of the ring-shaped sub-patterns as a deformation amount check mark, which can be made by visually observing, through the reverse face of the transparent substrate, the positional relationship between the ring-shaped sub-patterns and the external circumferential form of the corresponding dummy projection. For example, assuming that two ring-shaped sub-patterns are provided, it is judged that the deformation amount of each of the dummy projections is in an acceptable level if the external circumferential form of each of the dummy projections lies in an area between one of these two ring-shaped sub-patterns and the other thereof in a uniform manner. Otherwise, it is judged that the deformation amount of each of the dummy projections is not in an acceptable level. In this context, the term "uniform" means that the external circumferential form of each of the dummy projections lies in the area in such a manner that any points on the external circumference are located apart from the center of the corresponding one of the patterns by a substantially equal distance with one another.

In the configuration of the mount structure according to the first aspect of the invention described above, it is preferable that each of the patterns should have a gradation sub-pattern that has gradations formed in equal pitch, which is incremented outward from the center of the pattern.

With such a configuration, it is possible to quantitatively check (i.e., measure) the deformation amount of each of the dummy projections by reading the scale on the gradation sub-pattern of the pattern after the non-tentative mounting of the electronic component on the surface of the transparent substrate. Therefore, on the basis of the amount of deformation of the dummy projection, it is possible to indirectly check (estimate) the amount of deformation of the corresponding protruded electrodes with a greater accuracy. Consequently, the invention makes it possible to indirectly check (estimate) whether the electric connection between each of the protruded electrodes and the corresponding one of the terminals is in a good condition or not with a greater precision.

In the configuration of the mount structure according to the first aspect of the invention described above, it is preferable that the center of each of the patterns functions as an alignment mark that can be used for performing positional alignment between the center of the pattern and the center of the dummy projection at the time of mounting the electronic component on the surface of the transparent substrate.

With such a configuration, it is possible to tentatively mount the electronic component at an accurate position in the target region on the surface of the transparent substrate where the electronic component is supposed to be mounted, which is achieved by aligning the center of each of the dummy projections with the center of the corresponding pattern. It should be noted that, after the tentative mounting of the electronic component on the transparent substrate, it is possible to check whether the center of each of the dummy projections is in alignment with the center of the corresponding pattern or not by means of the method described below in an exemplary embodiment of the invention.

In order to address the above-identified problem without any limitation thereto, the invention provides, as a second aspect thereof, an electro-optical device that is provided with the mount structure having the configuration described above. In addition, in order to address the above-identified problem without any limitation thereto, the invention provides, as a third aspect thereof, an electronic apparatus that is provided with the electro-optical device having the configuration described above, the electro-optical device functioning as a display section of the electronic apparatus.

BRIEF DESCRIPTION OF THE DRAWINGS

The invention will be described with reference to the accompanying drawings, wherein like numbers reference like elements.

FIG. 1A is a plan view that schematically illustrates an example of the configuration of a mount structure according to an exemplary embodiment of the invention, whereas

Each of FIG. 4A

DESCRIPTION OF EXEMPLARY EMBODIMENTS

With reference to the accompanying drawings, the best mode for carrying out the present invention is described below.

Mount Structure

Figure 1A:
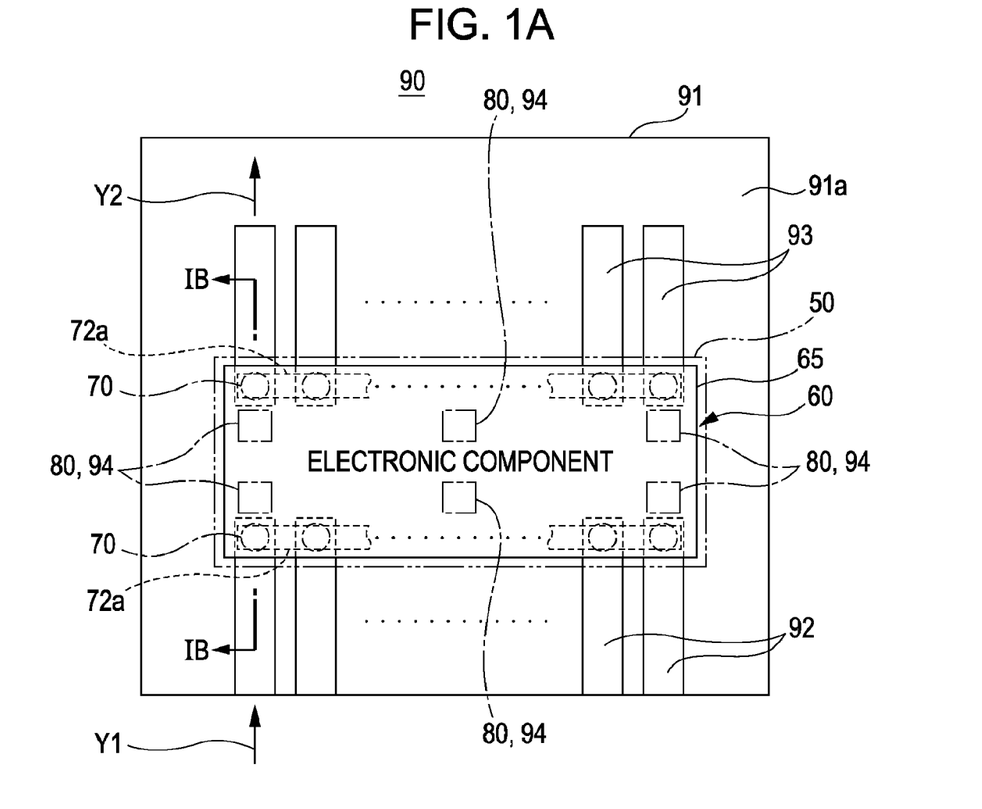
Figure 1B:
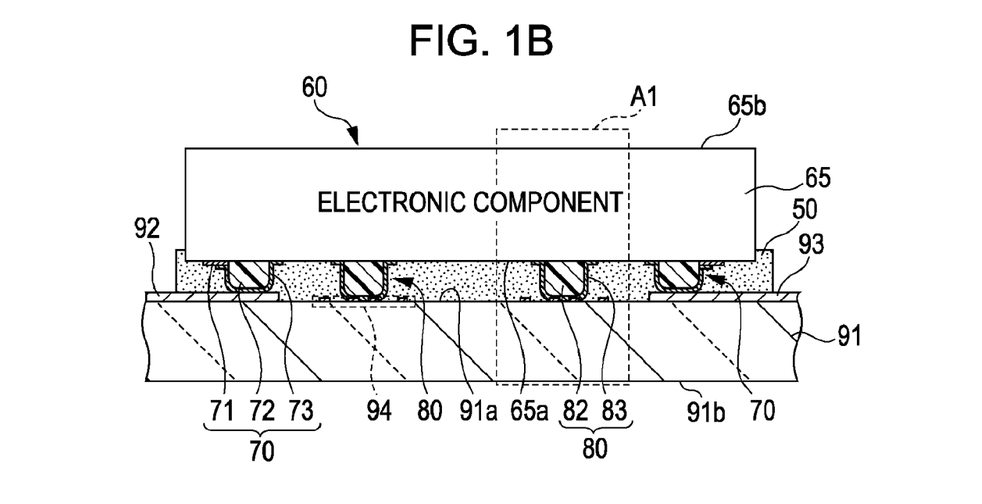
FIG. 1B is a sectional view that schematically illustrates the essential components of the mount structure illustrated in FIG. 1A.
Figure 2:
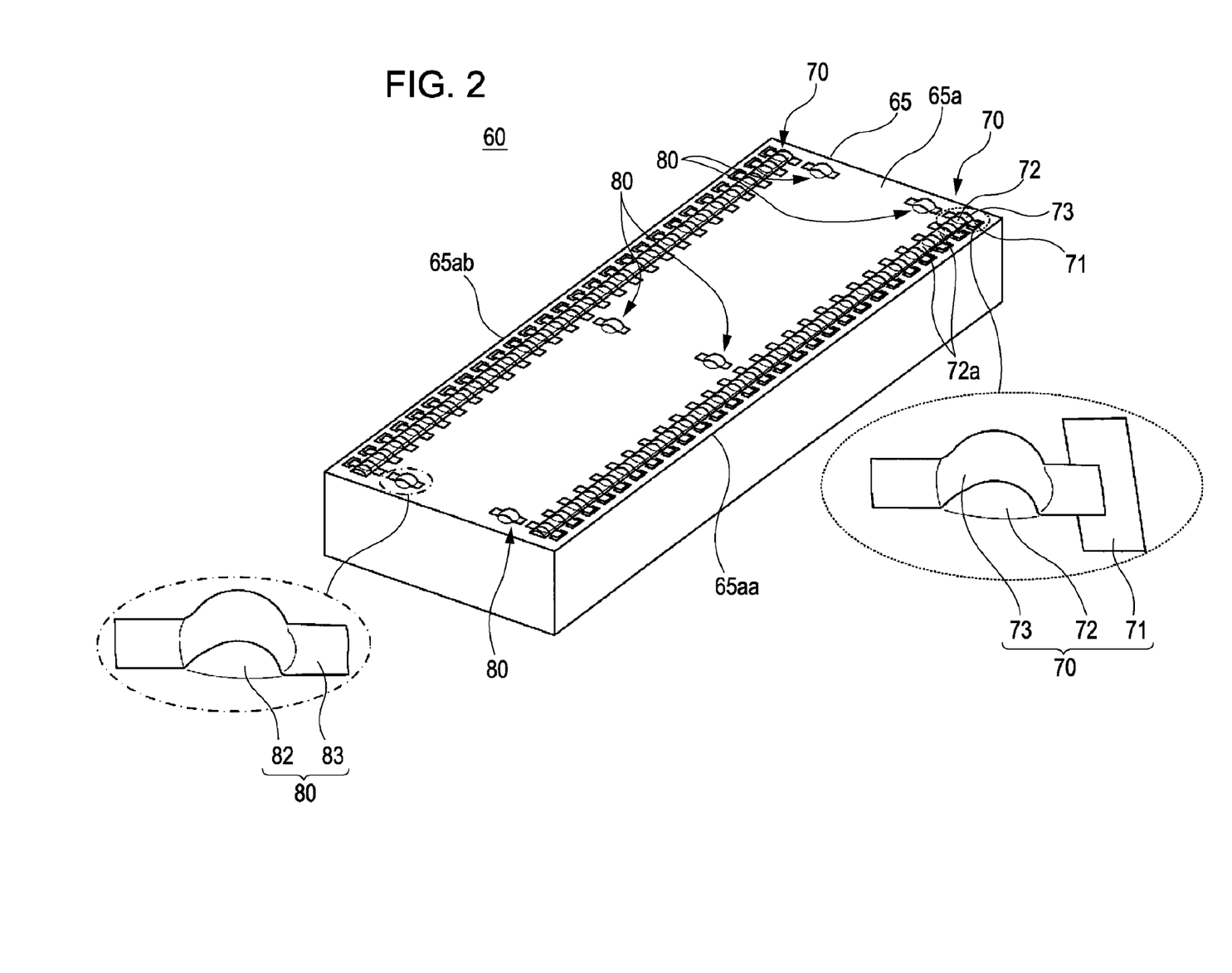
FIG. 2 is a perspective view that schematically illustrates an example of the configuration of an electronic component that constitutes a part of the mount structure according to the exemplary embodiment of the invention.
Figure 3:
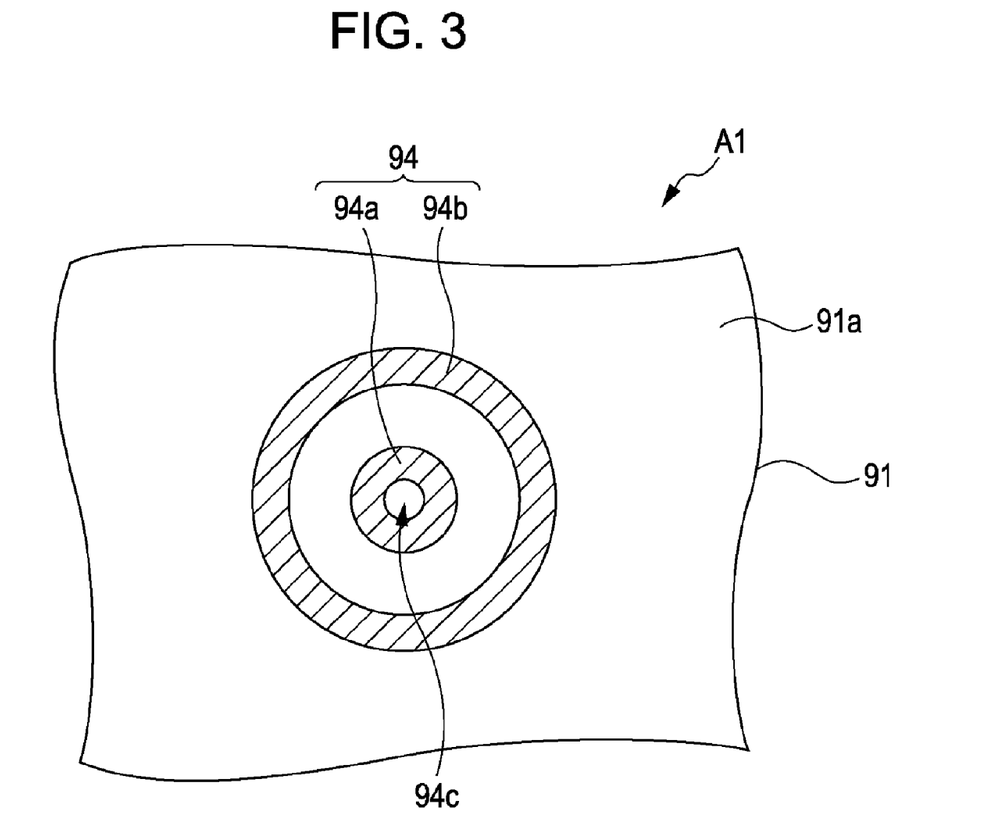
FIG. 3 is a plan view that schematically illustrates the essential part of a transparent substrate having patterns, where the transparent substrate constitutes a part of the mount structure according to the exemplary embodiment of the invention.

First of all, with reference to FIGS. 1-3, the configuration of a mount structure 90 according to an exemplary embodiment of the invention is described.

FIG. 1A is a plan view that schematically illustrates an example of the configuration of the mount structure 90 according to the present embodiment of the invention. FIG. 1B is an enlarged sectional view that schematically illustrates the essential components of the mount structure 90 taken along the line IB-IB of FIG. 1A. FIG. 2 is a perspective view that schematically illustrates an example of the configuration of an electronic component 60 that constitutes a part of the mount structure 90, which is observed from a side/surface on which electrodes 70 and other components are provided. FIG. 3 is a plan view that schematically illustrates the essential part of a transparent substrate 91 that constitutes a part of the mount structure 90, where the illustrated portion corresponds to a dotted quadrangle area A1 of FIG. 1B. In particular, FIG. 3 illustrates a pattern 94 that is formed on the main surface 91a of the transparent substrate 91.

The mount structure 90 is made up of, though not limited thereto, the electronic component of 60 such as an integrated circuit (IC) and the transparent substrate 91. The transparent substrate 91 is made of transparent material such as glass, quartz, or the like. The electronic component 60 is mounted on the transparent substrate 91.

The electronic component 60 is made of, for example, silicon (Si) or the like. The electronic component 60 is made up of, though not limited thereto, a base substance 65 having the shape of a substantially rectangular parallelepiped, a plurality of protruded electrodes 70 provided on the main surface 65a of the base substance 65, and a plurality of protruded dummy "electrodes" (projections) 80 provided on the main surface 65a of the base substance 65.

The plurality of electrodes 70 is arrayed along each of two sides 65aa and 65ab that are opposed to (i.e., extend in parallel with) each other on the main surface 65a of the base substance 65. A certain fixed interval/pitch is allocated each between two adjacent electrodes 70. In the illustrated example, the plurality of electrodes 70 is arrayed in one line along each of two sides 65aa and 65ab that extend in parallel with each other on the main surface 65a of the base substance 65. However, the invention is not limited to such an exemplary configuration. For example, it may be modified so that the plurality of electrodes 70 is arrayed in more than one line along each of two sides 65aa and 65ab that extend in parallel with each other on the main surface 65a of the base substance 65. As illustrated in the dotted oval area of FIG. 2, each of the plurality of electrodes 70 is made up of an electrode pad 71, a projection 72, and an electro-conductive film 73. The projection 72 is made of, for example, a resin material having elasticity. The stripe-shaped electro-conductive film 73 covers a part of the surface of the electrode pad 71 to extend across (i.e., further cover) the surface of the resinous projection 72. Each of the electrode pads 71 is made of an electrically conductive material such as metal. Each of the electro-conductive films 73 is also made of an electrically conductive material such as metal. In the illustrated example, each of the projections 72 has the shape of a hemisphere. Notwithstanding the foregoing, the shape of each of the projections 72 is not restricted to such a specific example described/illustrated herein. Each of two adjacent projections 72 are connected to each other via a connection portion 72a that is provided therebetween. Therefore, the projections 72 and the connection portions 72a are arrayed to substantially form a line.

As illustrated in an oval area encircled by an alternate long and short dash line in FIG. 2, each of the plurality of dummy projections 80 is made up of a projection 82 and an electro-conductive film 83. The projection 82 is made of, for example, a resin material having elasticity. The stripe-shaped electro-conductive film 83 extends across (i.e., covers), at least, the surface of the resinous projection 82. Each of the dummy projections 80 is configured not to be electrically conductive with the pattern 94, which will be described later.

Each of the dummy projections 80 has a shape that becomes elastically deformed by a certain deformation amount when the electronic component 60 is mounted on the transparent substrate 91. Specifically, it becomes deformed by an amount having a certain predetermined deformation ratio relative to the amount of deformation of each of the electrodes 70, which also becomes elastically deformed due to the mechanical pressure applied by the electronic component 60 onto the main surface 91a of the transparent substrate 91. Herein, the predetermined deformation ratio may be set in the following range: the deformation amount of the electrodes 70 to the deformation amount of the dummy projections 80=1-9:9-1. Therefore, it is possible to indirectly check, and estimate, the amount of elastic deformation of the deformed electrodes 70 by inspecting the amount of elastic deformation of the deformed dummy projections 80 (including the area size, shape, and the like of the deformed projection; the same applies hereunder). The amount of deformation of each of the deformed dummy projections 80 can be inspected by visually observing the positional relationship between the deformed dummy projection 80 that is now being inspected and the corresponding pattern 94, which will be described later.

In the illustrated example, each of the projections 82 has the shape of a hemisphere. In a preferred example, each of the projections 82 should have the same shape as that of each of the projections 72. The reason why each of the projections 82 should, preferably, have the same shape as that of each of the projections 72 is that it becomes easier to check/estimate the amount of elastic deformation of the deformed electrodes 70 after the mounting of the electronic component 60 on the substrate because, if so configured, the amount of elastic deformation of the deformed dummy projections 80 is substantially the same as the amount of elastic deformation of the deformed electrodes 70. Notwithstanding the foregoing, the shape of each of the projections 82 is not restricted to such a specific example described/illustrated herein. In order to simplify the manufacturing process thereof, it is preferable that each of the projections 82 of the dummy projections 80 should be made of the same material as that of each of the projections 72 of the electrodes 70. In order to further simplify the manufacturing process thereof, it is preferable that each of the electro-conductive films 83 of the dummy projections 80 should be made of the same material as that of each of the electro-conductive films 73 of the electrodes 70. In the illustrated example, the dummy projections 80 are provided at positions close to the electrodes 70 that are arrayed in one line along each of two sides 65aa and 65ab that extend in parallel with each other on the main surface 65a of the base substance 65. To be exact, the dummy projections 80 are provided in the proximity of both of the ends and the center of an inner non-existent virtual line that extends adjacent to the above-mentioned line of the electrodes 70 extending along each of two sides 65aa and 65ab. Notwithstanding the foregoing, the positions of the dummy projections 80 are not restricted to the specific example illustrated/described herein; that is, the dummy projections 80 may be provided anywhere on the main surface 65a of the base substance 65 as long as they do not overlap the electrodes 70.

In addition, the configuration of each of the dummy projections 80 is not restricted to the specific example illustrated/described herein; for example, each of the dummy projections 80 may be made of a resin material only. As another modification example, each of the dummy projections 80 may be configured to have a shape that is not the same as that of each of the electrodes 70. That is, each of the dummy projections 80 may be made of any alternative material, and/or each of the dummy projections 80 may be configured to have any alternative shape, as long as it is possible to visually observe the amount of deformation (i.e., collapsing amount, or in other words, shape-change amount) thereof. Even if the material and/or shape of each of the dummy projections 80 are/is not the same as those/that of each of the electrodes 70, it is still possible to make a judgment as to whether the electric connection between each of the electrodes 70 and the corresponding input terminal 92/output terminal 93, which will be described later, is in a good condition or not by using a judgment method (i.e., deformation amount check method) that will also be described later as long as the predetermined collapsing amount, or in other words, shape-change amount of each of the dummy projections 80 falls within a predetermined range.

The transparent substrate 91 is provided with a plurality of input terminals 92 and a plurality of output terminals 93 that are electrically connected to the electro-conductive films 73 of the electrodes 70, respectively. The transparent substrate 91 is further provided with a plurality of patterns 94.

Each of the input terminals 92 is made of an electrically conductive material such as metal. Each of the output terminals 93 is also made of an electrically conductive material such as metal. As shown by an arrow Y1 in FIG. 1A, an electric signal is inputted from an external source to each of the plurality of input terminals 92 via a wiring board such as a flexible printed circuit (hereafter abbreviated as "FPC"). On the other hand, as shown by an arrow Y2 in FIG. 1A, an electric signal is outputted from each of the plurality of output terminals 93 via the electronic component 60. The electric signal outputted from each of the plurality of output terminals 93 is subjected to, for example, signal processing performed by a signal processing circuit that is not shown in the drawing.

Each of the patterns 94 is made of an electrically conductive material such as metal. Each of the patterns 94 is configured not to be electrically conductive with the dummy projection 80. In a preferred example, in order to simplify the manufacturing process thereof, each of the patterns 94 should be made of the same electrically conductive material as that of each of the plurality of input terminals 92 and each of the plurality of output terminals 93. Notwithstanding the foregoing, the material of each of the patterns 94 is not restricted to such a specific example described herein. For example, it may be made of a resin material. Each of the patterns 94 is formed at a position corresponding to the dummy projection 80 on the main surface 91a of the transparent substrate 91. Each of the patterns 94 is used for checking the amount of elastic deformation of the corresponding dummy projection 80 that is deformed because of a mechanical pressure applied when the electronic component 60 is mounted onto the main surface 91a of the transparent substrate 91. Specifically, in the illustrated example, each of the patterns 94 is made up of a plurality of concentric ring-shaped sub-patterns 94a and 94b as shown in FIG. 3. Each of the ring-shaped sub-patterns 94a and 94b functions as a deformation amount check mark that can be used for checking the amount of deformation of the corresponding dummy projection 80. Specifically, when each of the patterns 94 and the corresponding dummy projection 80 are viewed from the reverse side, that is, the reverse face 91b, of the transparent substrate 91, which is opposite the main surface 91a thereof, the positional relationship between the ring-shaped sub-patterns 94a and 94b and the corresponding dummy projection 80 that has been elastically deformed at the time of the mounting of the electronic component 60 on the substrate 91 is visually observed. By this means, it is possible to check the amount of deformation of each of the dummy projections 80. A more detailed explanation will be given later as to how the amount of deformation thereof is checked. The center 94c of each of the patterns 94 functions as an alignment mark (i.e., positional determination reference mark; the same applies hereunder) that can be used for mounting the electronic component 60 at an accurate position in a target region on the main surface 91a of the transparent substrate 91 where the electronic component 60 is supposed to be mounted.

The mount structure 90 having the configuration described above is formed by mounting the electronic component 60 on the main surface 91a of the transparent substrate 91 by means of an adhesive 50, where it is adhered thereto after establishing an electric connection of the electro-optical conductive film 73 of each of the electrodes 70 to the corresponding one of the input terminals 92/output terminals 93 and further after aligning each of the dummy projections 80 at a position corresponding to the pattern 94.

Figure 4A:
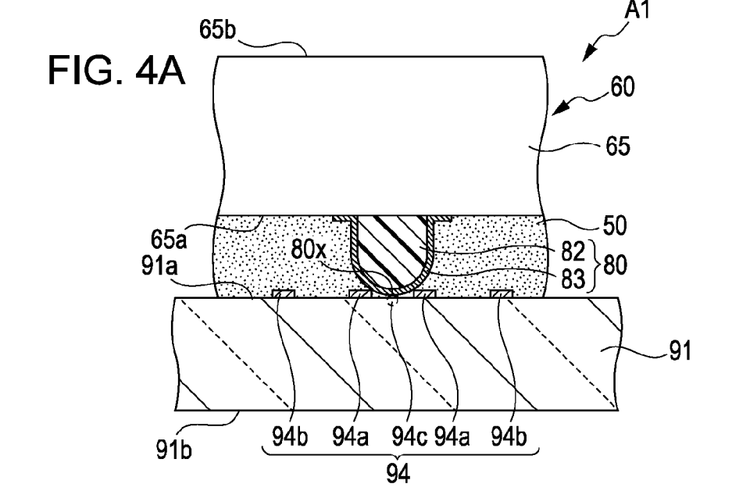
Figure 4B:
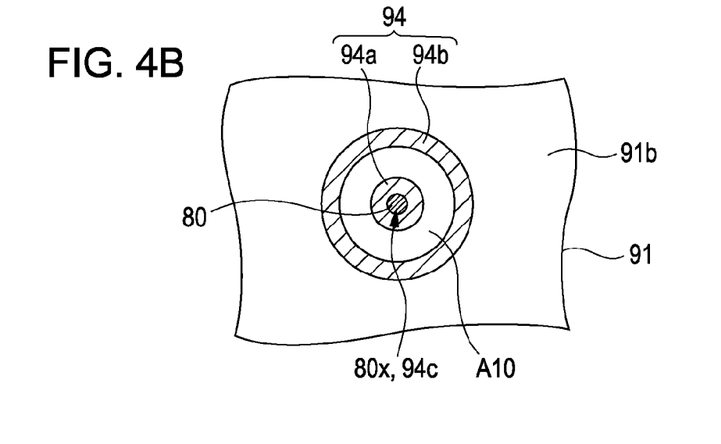

Method for Aligning Electronic Component with Transparent Substrate by Using Dummy Projection and Pattern Next, with reference to FIGS. 4A and 4B, an explanation is given of a method for aligning the position of the electronic component 60 on the main surface 91a of the transparent substrate 91 by means of each of the dummy projections 80 and the corresponding pattern 94.

FIG. 4A is a sectional view that schematically illustrates the essential part of the mount structure 90 after the tentative mounting of the electronic component 60, where the illustrated sectional view corresponds to the quadrangle area A1 of FIG. 1B that is enclosed by the dotted box. Herein, the term "tentative mounting" means a state in which the electronic component 60 is placed (and tentatively fixed), without (permanent) mount fixation thereof, in a target region on the main surface 91a of the transparent substrate 91 where the electronic component 60 is supposed to be mounted. FIG. 4B is a plan view that schematically illustrates the essential part of the mount structure 90 illustrated in the corresponding sectional view FIG. 4A after the non-tentative mounting of the electronic component 60, where each of the patterns 94 and the corresponding dummy projection 80 are viewed from the reverse side, that is, the reverse face 91b, of the transparent substrate 91, which is opposite the main surface 91a thereof. Herein, the term "non-tentative mounting" means a state in which the electronic component 60 is fixed at the aligned position in the target region on the main surface 91a of the transparent substrate 91 where the electronic component 60 is supposed to be mounted.

In the present embodiment of the invention, the center 94c of each of the patterns 94 functions as an alignment mark (i.e., positional determination reference mark) that can be used for mounting the electronic component 60 at an accurate position in the target region on the main surface 91a of the transparent substrate 91 where the electronic component 60 is supposed to be mounted. Therefore, in the manufacturing process of the mount structure 90, it is possible to tentatively mount the electronic component 60 at an accurate position in the target region on the main surface 91a of the transparent substrate 91 where the electronic component 60 is supposed to be mounted, which is achieved by aligning the apex portion (i.e., center; the same applies hereunder) 80x of each of the dummy projections 80 with the center 94c of the corresponding pattern 94 by using a known alignment technique/method.

In the following description, a brief explanation is given of the known alignment technique/method. In FIGS. 4A and 4B, as a first step, the electronic component 60 is moved onto the main-surface side (91a) of the transparent substrate 91; as a next step, while aligning the apex portion 80x of each of the dummy projections 80 with the center 94c of the corresponding pattern 94, the electronic component 60 is placed onto the main surface 91a of the transparent substrate 91 by means of the adhesive 50. By this means, it is possible to tentatively mount the electronic component 60 at the accurate position in the target region on the main surface 91a of the transparent substrate 91 where the electronic component 60 is supposed to be mounted.

In the present embodiment of the invention, it is possible to visually check whether or not the electronic component 60 has been tentatively mounted at the accurate position in the target region on the main surface 91a of the transparent substrate 91 where the electronic component 60 is supposed to be mounted. Such a visual check (i.e., observation) can be made after the completion of the tentative mounting of the electronic component 60, observed from the opposite-surface side (91b) of the transparent substrate 91.

Specifically, the visual check is performed as follows. As illustrated in FIG. 4B, each of the patterns 94 and the corresponding dummy projection 80 are monitored from the reverse side, that is, the reverse face 91b, of the transparent substrate 91, which is opposite the main surface 91a thereof, after the completion of the tentative mounting of the electronic component 60. Then, it is judged whether the apex portion 80x of each of the dummy projections 80 is aligned with the center 94c of the corresponding pattern 94 or not. If it is judged that the apex portion 80x of each of the dummy projections 80 is in alignment with the center 94c of the corresponding pattern 94, it means that the electronic component 60 has been tentatively mounted at the accurate position in the target region on the main surface 91a of the transparent substrate 91 where the electronic component 60 is supposed to be mounted. It should be noted that FIG. 4B illustrates a case where the apex portion 80x of the dummy projection 80 is in alignment with the center 94c of the corresponding pattern 94. On the other hand, if it is judged that the apex portion 80x of each of the dummy projections 80 is not in alignment with the center 94c of the corresponding pattern 94, it means that the electronic component 60 has been tentatively mounted at an inaccurate position in the target region on the main surface 91a of the transparent substrate 91 where the electronic component 60 is not supposed to be mounted. In such a case, the tentatively-fixed electronic component 60 is removed from the main surface 91a of the transparent substrate 91. Then, by means of the known positional alignment technique/method described above, a retry alignment operation is performed so as to tentatively mount the electronic component 60 at the accurate position in the target region on the main surface 91a of the transparent substrate 91 where the electronic component 60 is supposed to be mounted. By this means, it is possible to enhance the "rework-ability" of the electronic component 60.

Figure 4C:
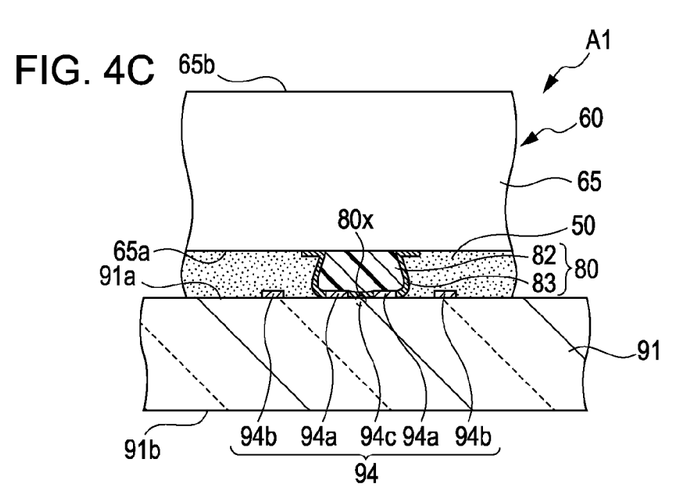
FIG. 4C is a sectional view that schematically illustrates the essential part of the mount structure according to the exemplary embodiment of the invention, where the electronic component is mounted on the transparent substrate, whereas each of FIG. 4B
Figure 4D:
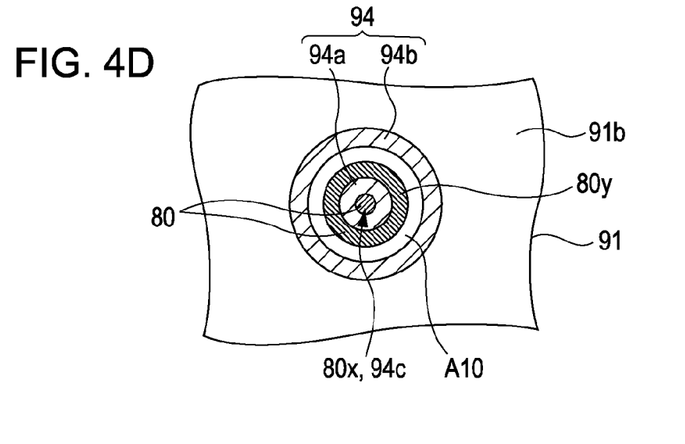
FIG. 4D is a plan view that corresponds to FIG. 4A and FIG. 4C.

Method for Checking Deformation Amount of Electrode by Using Dummy Projection and Pattern Next, with reference to FIGS. 4C and 4D, an explanation is given of a method for checking the amount of deformation of each of the electrodes 70 by means of each of the dummy projections 80 and the corresponding pattern 94.

FIG. 4C is a sectional view that schematically illustrates the essential part of the mount structure 90 after the non-tentative mounting of the electronic component 60, where the illustrated sectional view corresponds to the quadrangle area A1 of FIG. 1B that is enclosed by the dotted box. FIG. 4D is a plan view that schematically illustrates the essential part of the mount structure 90 illustrated in the corresponding sectional view FIG. 4C after the non-tentative mounting of the electronic component 60, where each of the patterns 94 and the corresponding dummy projection 80 are viewed from the reverse side, that is, the reverse face 91b, of the transparent substrate 91, which is opposite the main surface 91a thereof.

In the manufacturing process of the mount structure 90 according to the present embodiment of the invention, after the tentative mounting of the electronic component 60 at the accurate position in the target region on the main surface 91a of the transparent substrate 91 where the electronic component 60 is supposed to be mounted, the electronic component 60 is non-tentatively mounted thereat on the main surface 91a of the transparent substrate 91 by means of a thermo compression bonding technique or a similar alternative method. If a pressing force is not applied to the entire surface of the reverse face 65b of the electronic component 60, which is opposite the main surface 65a thereof, in a uniform manner in the course of the thermo compression bonding, the electronic component 60 could be non-tentatively mounted on the main surface 91a of the transparent substrate 91 with both ends of the electronic component 60 being warped upward. Or, as a result of the application of such a non-uniform pressing force, the electronic component 60 could be non-tentatively mounted on the main surface 91a of the transparent substrate 91 in a slanted position.

If the electronic component 60 is mounted in a warped or slanted state, the deformation amount of the electrodes 70 vary from one to another depending on their respective positions on the electronic component 60; that is, too much pressure is applied to some of the electrodes 70 so that the amount of deformation thereof is too large. On the other hand, insufficient pressure is applied to some of the electrodes 70 so that the amount of deformation thereof is too small. In particular, in the latter case, since the amount of deformation of the electrode 70 is too small if insufficient pressure is applied thereto, the contact area between the electrode 70 and the input terminal 92/output terminal 93 is insufficiently small. Consequently, there is a risk of a contact failure therebetween. If the deformation amount of the electrodes 70 is checked in one way or another after the non-tentative mounting of the electronic component 60 so as to determine whether it is in a good deformation condition or in a poor deformation condition, it is possible to judge whether the non-tentative mounting of the electronic component 60 has been performed appropriately or not in an easy manner. If it is judged that the deformation amount of the electrodes 70 is not in an acceptable (i.e., good, sufficient, desirable, or the like; the same applies hereunder) level, it means that there is a high possibility of a contact failure therebetween. In such a case, the electronic component 60 is removed from the transparent substrate 91 so as to redo the non-tentative mounting of the electronic component 60. By this means, it is possible to enhance the rework-ability of the electronic component 60.

In the present embodiment of the invention, after the tentative mounting of the electronic component 60, the deformation amount of each of the dummy projections 80 is visually observed through the transparent substrate 91 on the basis of the positional relationship between each of the dummy projections 80, which was elastically deformed at the time of the mounting of the electronic component 60 on the substrate 91, and the corresponding pattern 94. Then, on the basis of the deformation amount of each of the dummy projections 80, the deformation amount of each of the electrodes 70 is indirectly checked (i.e., estimated). If it is judged that the deformation amount of each of the dummy projections 80 is in an acceptable level in comparison with the corresponding one of the patterns 94, which is used as a reference for judgment, it is indirectly judged that the deformation amount of each of the electrodes 70 is also in an acceptable level and thus that the electric connection between each of the electrodes 70 and the corresponding one of the input terminals 92 and the output terminals 93 is in a good condition. On the other hand, if it is judged that the deformation amount of each (more correctly, one or more; the same applies hereunder) of the dummy projections 80 is not in an acceptable level (i.e., is in an insufficient level) in comparison with the corresponding one of the patterns 94, which is used as a reference for judgment, it is indirectly judged that the deformation amount of each (corresponding one(s)) of the electrodes 70 is also not in an acceptable level and thus that the electric connection between each of the electrodes 70 and the corresponding one of the input terminals 92 and the output terminals 93 is in a poor condition. In the following description, an explanation is given as to how the amount of deformation thereof is checked.

In the present embodiment of the invention, it is indirectly judged that the deformation amount of each of the electrodes 70 is in an acceptable level and thus that the electric connection between each of the electrodes 70 and the corresponding one of the input terminals 92 and the output terminals 93 is in a good condition if, when each of the patterns 94 and the corresponding dummy projection 80 are viewed from the reverse side, that is, the reverse face 91b, of the transparent substrate 91, which is opposite the main surface 91a thereof after the tentative mounting of the electronic component 60, the external circumferential form (i.e., silhouette, or contour; the same applies hereunder) 80y of each of the dummy projections 80 that was elastically deformed at the time of the mounting of the electronic component 60 on the substrate 91 lies in an area A10 between the ring-shaped sub-pattern 94a and the ring-shaped sub-pattern 94b in a uniform manner as illustrated in FIG. 4D. In this context, the term "uniform" means that the external circumferential form 80y of each of the dummy projections 80 lies in the area A10 in such a manner that any points on the external circumference 80y are located apart from the center 94c of the corresponding one of the patterns 94 by a substantially equal distance with one another. In the example illustrated in FIG. 4D, the external circumferential form 80y of each of the elastically-deformed dummy projections 80 lies in the area A10 between the ring-shaped sub-pattern 94a and the ring-shaped sub-pattern 94b in a uniform manner. Accordingly, it is indirectly judged that the deformation amount of each of the electrodes 70 is in an acceptable level and thus that the electric connection between each of the electrodes 70 and the corresponding one of the input terminals 92 and the output terminals 93 is in a good condition. On the other hand, it is indirectly judged that the deformation amount of each of the electrodes 70 is not in an acceptable level and thus that the electric connection between each of the electrodes 70 and the corresponding one of the input terminals 92 and the output terminals 93 is in a poor condition if the external circumferential form 80y of each of the dummy projections 80 that was elastically deformed at the time of the mounting of the electronic component 60 on the substrate 91 lies in the area A10 between the ring-shaped sub-pattern 94a and the ring-shaped sub-pattern 94b in a non-uniform manner. In this context, the term "non-uniform" means that the external circumferential form 80y of each of the dummy projections 80 lies in the area A10 in such a manner that circumferential points on the external circumference 80y are located apart from the center 94c of the corresponding one of the patterns 94 by substantially unequal distances with one another. In addition to such a case, it is indirectly judged that the deformation amount of each of the electrodes 70 is not in an acceptable level and thus that the electric connection between each of the electrodes 70 and the corresponding one of the input terminals 92 and the output terminals 93 is in a poor condition if the external circumferential form 80y of each of the elastically-deformed dummy projections 80 does not lie in the area A10 between the ring-shaped sub-pattern 94a and the ring-shaped sub-pattern 94b; for example, if the external circumferential form 80y of each of the elastically-deformed dummy projections 80 overlaps either the ring-shaped sub-pattern 94a or the ring-shaped sub-pattern 94b when viewed in two dimensions, it is indirectly judged that the deformation amount thereof is not in an acceptable level and thus that the electric connection therebetween is in a poor condition.

As described above, the mount structure 90 according to the present embodiment of the invention is provided with the dummy projections 80 each of which becomes elastically deformed by a certain deformation amount when the electronic component 60 is mounted on the transparent substrate 91, where the above-mentioned deformation amount has a certain predetermined deformation ratio relative to the amount of deformation of each of the electrodes 70, which also becomes elastically deformed due to the mechanical pressure applied by the electronic component 60 onto the main surface 91a of the transparent substrate 91. In addition, the mount structure 90 according to the present embodiment of the invention is further provided with the patterns 94 each of which is formed at a position corresponding to the dummy projection 80 on the main surface 91a of the transparent substrate 91, where each of the patterns 94 is used for checking the amount of elastic deformation of the corresponding dummy projection 80 when making visual observation through the reverse face (i.e., opposite surface) 91b of the transparent substrate 91.

With such a configuration, it is possible to visually observe the positional relationship (i.e., makes a visual comparison) between each of the elastically-deformed dummy projections 80 and the corresponding one of the patterns 94 when each of the patterns 94 and the corresponding dummy projection 80 are viewed through the reverse face 91b of the transparent substrate 91. By this means, it is possible to check the amount of deformation of each of the dummy projections 80. Then, on the basis of the deformation amount of each of the dummy projections 80, it is possible to indirectly check (i.e., estimate) the deformation amount of each of the electrodes 70. Consequently, the invention makes it possible to indirectly check (estimate) whether the electric connection between each of the electrodes 70 and the corresponding one of the input terminals 92 and the output terminals 93 is in a good condition or not. If it is judged that the deformation amount of a certain electrode(s) 70 is not in an acceptable level, it means that there is a high possibility of a contact/connection failure between the above-mentioned certain electrode(s) 70 and the corresponding one(s) of the input terminals 92 and the output terminals 93. In such a case, the electronic component 60 is removed from the transparent substrate 91 so as to redo the non-tentative mounting of the electronic component 60. By this means, it is possible to enhance the rework-ability of the electronic component 60.

In a preferred example, each of the dummy projections 80 should have the same shape as that of each of the electrodes 70. The reason why each of the dummy projections 80 should, preferably, have the same shape as that of each of the electrodes 70 is that it becomes easier to indirectly check/estimate the amount of elastic deformation of the deformed electrodes 70 after the mounting of the electronic component 60 on the substrate because, if so configured, the amount of elastic deformation of the deformed electrodes 70 is substantially the same as the amount of elastic deformation of the deformed dummy projections 80, which means that it becomes easier to indirectly check/estimate whether the electric connection between each of the electrodes 70 and the corresponding one of the input terminals 92 and the output terminals 93 is in a good condition or not.

In the present embodiment of the invention, each of the dummy projections 80 as well as each of the electrodes 70 has the shape of a hemisphere. In addition, in the present embodiment of the invention, each of the patterns 94 is made up of the plurality of concentric ring-shaped sub-patterns 94a and 94b. In such a configuration, each of the ring-shaped sub-patterns 94a and 94b functions as a deformation amount check mark that can be used for checking the amount of deformation of the corresponding dummy projection 80. When each of the patterns 94 and the corresponding dummy projection 80 are viewed from the reverse side, that is, the reverse face 91b of the transparent substrate 91, which is opposite the main surface 91a thereof, the positional relationship between the ring-shaped sub-patterns 94a and 94b and the external circumferential form 80y of the corresponding dummy projection 80 that has been elastically deformed at the time of the mounting of the electronic component 60 on the substrate 91 is visually observed. By this means, it is possible to check the amount of deformation of each of the dummy projections 80.

With such a configuration, since each of the dummy projections 80 as well as each of the electrodes 70 has the shape of a hemisphere, each of them is elastically deformed into a circular shape in a plan view as a result of the mounting of the electronic component 60 on the substrate 91. Therefore, the invention makes it possible to check the amount of deformation of each of the dummy projections 80 in an easy manner while using each of the ring-shaped sub-patterns 94a and 94b as a deformation amount check mark, which can be made by visually observing, through the reverse face 91b of the transparent substrate 91, the positional relationship between the ring-shaped sub-patterns 94a and 94b (inner circumference or outer circumference thereof) and the external circumferential form 80y of the corresponding dummy projection 80. For example, as has already been described above, it is judged that the deformation amount of each of the dummy projections 80 is in an acceptable level if the external circumferential form 80y of each of the dummy projections 80 lies in the area A10 between the ring-shaped sub-pattern 94a and the ring-shaped sub-pattern 94b in a uniform manner. Otherwise, it is judged that the deformation amount of each of the dummy projections 80 is not in an acceptable level.

In the exemplary embodiment of the invention described above, each of the patterns 94 is made up of two concentric ring-shaped sub-patterns 94a and 94b. However, the invention is not restricted to such a specific example. For example, the invention may be modified in such a manner that each of the patterns 94 is made up of three or more concentric ring-shaped sub-patterns. If so configured, the increased number of the concentric ring-shaped sub-patterns improves the accuracy in the visual observation of the positional relationship between the ring-shaped sub-patterns and the external circumferential form 80y of each of the dummy projections 80. Therefore, it is possible to check the amount of deformation of each of the dummy projections 80 with a greater precision.

In the present embodiment of the invention, the base substance 65 of the electronic component 60 has the shape of a substantially rectangular parallelepiped. In addition, in the present embodiment of the invention, the plurality of electrodes 70 is arrayed along each of two sides 65aa and 65ab that are opposed to, that is, extend in parallel with, each other on the main surface 65a of the base substance 65, whereas the dummy projections 80 are provided at positions close to the electrodes 70 that are arrayed in, for example, one line (not limited thereto) along each of two sides 65aa and 65ab that extend in parallel with each other on the main surface 65a of the base substance 65, where the dummy projections 80 are provided in the proximity of both of the ends and the center of an inner non-existent virtual line that extends adjacent to the above-mentioned line of the electrodes 70 extending along each of two sides 65aa and 65ab. With such a configuration, the invention makes it possible to check whether or not the electronic component 60 is non-tentatively mounted substantially on the entire main surface 91a of the transparent substrate 91 in a uniform manner. In other words, the deformation amount check method described above makes it possible to indirectly check (estimate) whether the deformation amount of each of substantially all of the electrodes 70 of the electronic component 60 is in an acceptable level or not by visually observing the deformation amount of each of the dummy projections 80. Consequently, the invention makes it possible to indirectly check (estimate) whether the electric connection between each of substantially all of the electrodes 70 and the corresponding one of the input terminals 92 and the output terminals 93 is in a good condition or not.

As a modified example of the invention, each of the patterns may be graduated in equal pitch on each axis, which is incremented from the center of the pattern toward each of the outer ends thereof. If so configured, it is possible to quantitatively measure the deformation amount of each of the dummy projections 80 by reading the graduation thereof while applying the deformation amount check method described above. By this means, it is possible to check the deformation amount of each of the dummy projections 80 with a greater precision. In the following description, such a modified configuration of the invention is explained as Variation Example 1.

Figure 5A:
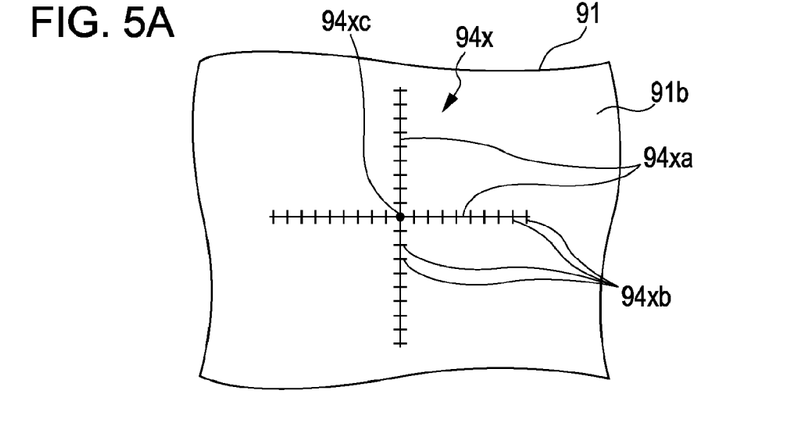
FIGS. 5A, 5B, and 5C is a set of plan views that schematically illustrates the essential part of a modified mount structure, in particular, a modified pattern, according to a first variation example of the invention.

FIG. 5A is a plan view that schematically illustrates the essential part of a modified mount structure, in particular, a modified pattern, according to a first variation example of the invention after the non-tentative mounting of the electronic component 60, where each of the patterns 94 and the corresponding dummy projection 80 are viewed from the reverse side, that is, the reverse face 91b, of the transparent substrate 91, which is opposite the main surface 91a thereof.

The pattern 94x according to the first variation example of the invention is made up of a cross sub-pattern 94xa that has the shape of a cross and a gradation sub-pattern 94xb that constitutes gradations formed in equal pitch on each axis, which is incremented from the center of the pattern 94x toward each of the outer ends thereof. In a preferred example, in order to simplify the manufacturing process thereof, each of the patterns 94x should be made of the same electrically conductive material as that of each of the plurality of input terminals 92 and each of the plurality of output terminals 93. Notwithstanding the foregoing, the material of each of the patterns 94x is not restricted to such a specific example described herein. The center 94xc of each of the patterns 94x functions as an alignment mark (i.e., positional determination reference mark) that can be used for mounting the electronic component 60 at an accurate position in a target region on the main surface 91a of the transparent substrate 91 where the electronic component 60 is supposed to be mounted.

With such a configuration, it is possible to tentatively mount the electronic component 60 at an accurate position in the target region on the main surface 91a of the transparent substrate 91 where the electronic component 60 is supposed to be mounted, which is achieved by aligning the apex portion (i.e., center) 80x of each of the dummy projections 80 with the center 94xc of the corresponding pattern 94x. It should be noted that, after the tentative mounting of the electronic component 60 on the substrate 91, it is possible to check whether the apex portion 80x of each of the dummy projections 80 is in alignment with the center 94xc of the corresponding pattern 94x or not by means of the method described above in the foregoing exemplary embodiment of the invention.

Figure 5B:
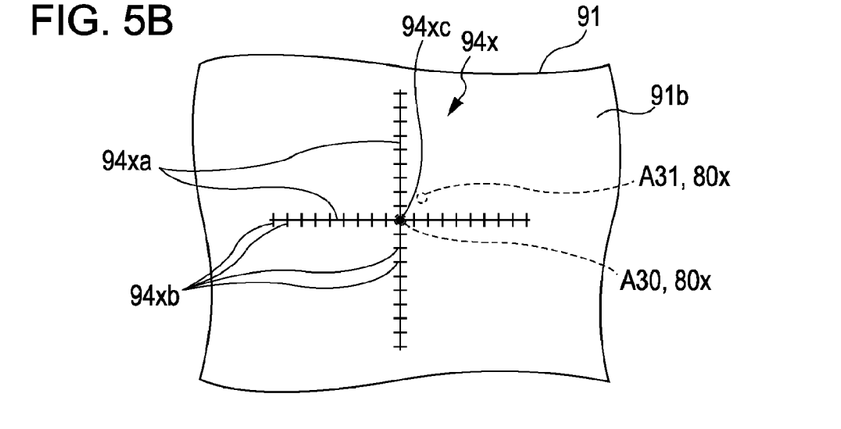

For example, as illustrated in FIG. 5B, which corresponds to FIG. 5A, if the apex portion (center) 80x of the check-target dummy projection 80 lies in an area A30 (i.e., in alignment with the center 94xc of the corresponding pattern 94x), it follows that the electronic component 60 is tentatively mounted at the accurate position in the target region on the main surface 91a of the transparent substrate 91. On the other hand, if the apex portion (center) 80x of the check-target dummy projection 80 lies in an area A31 (i.e., in an area enclosed by an open dotted circle), it follows that the electronic component 60 is tentatively mounted at an inaccurate position in the target region on the main surface 91a of the transparent substrate 91.

With such a configuration, it is possible to quantitatively check (i.e., measure) the deformation amount of each of the dummy projections 80 by reading the scale on the gradation sub-pattern 94xb of the pattern 94x after the non-tentative mounting of the electronic component 60 on the main surface 91a of the transparent substrate 91. Therefore, on the basis of the amount of deformation of the dummy projection 80, it is possible to indirectly check (estimate) the amount of deformation of the corresponding electrodes 70 with a greater accuracy. Consequently, the above-described variation example of the invention makes it possible to indirectly check (estimate) whether the electric connection between each of the electrodes 70 and the corresponding one of the input terminals 92 and the output terminals 93 is in a good condition or not with a greater accuracy.

Figure 5C:
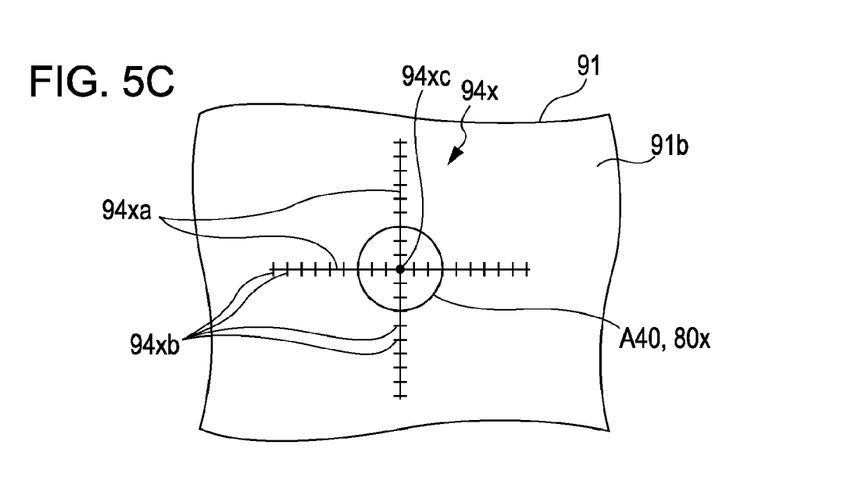

For example, as illustrated in FIG. 5C, which corresponds to FIG. 5A, if the apex portion (center) 80x of the check-target dummy projection 80, which was elastically deformed in the course of the mounting of the electronic component 60, lies in an area A40, the external circumferential form 80y of the dummy projection 80 after the non-tentative mounting thereof overlaps the third gradation on the gradation sub-pattern 94xb of the pattern 94x on each axis, which is counted from the center 94xc of the pattern 94x toward each of the outer ends thereof. Thus, taking the reading thereof, it is possible to check (i.e., calculate) the amount of deformation of the dummy projection 80 accurately, including but not limited to its shape and area size.

Example of Application of the Invention to Electro-Optical Device

Figure 6:
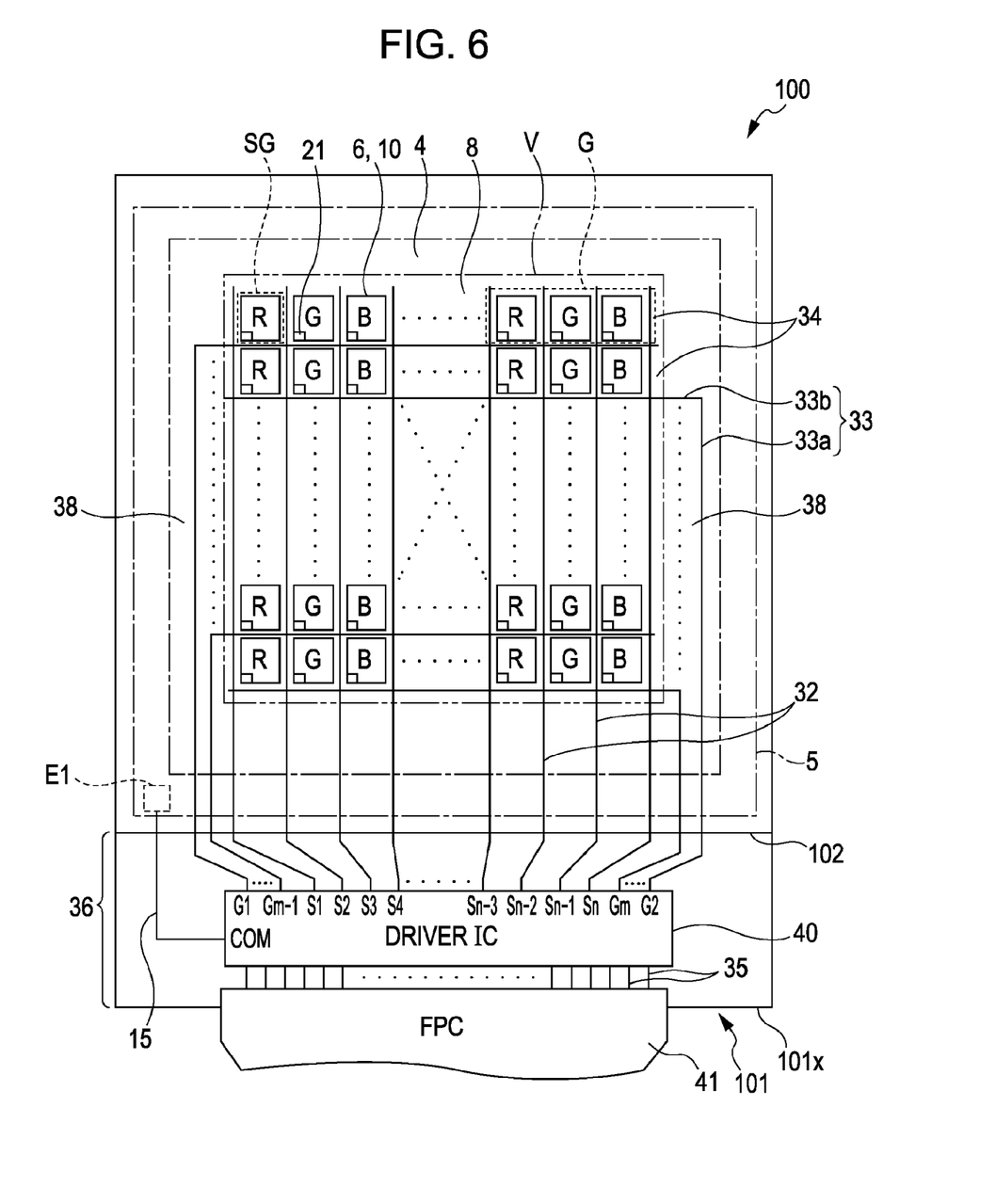
FIG. 6 is a plan view that schematically illustrates an application example in which the mount structure according to the exemplary embodiment of the invention is applied to a liquid crystal device.

Next, with reference to FIG. 6, an explanation is given of the configuration of a liquid crystal device, which is taken as an example of an electro-optical device to which the mount structure 90 described above is applied. It should be noted that the invention puts no restriction/limitation on the configuration of a liquid crystal device or on the driving method thereof. Therefore, needless to say, it should be understood that the following description on the configuration, and the like, of the liquid crystal device provides a non-limiting example for the implementation/application of the invention.

Configuration of Liquid Crystal Device

FIG. 6 is a plan view that schematically illustrates an example of the configuration of a liquid crystal device 100 according to one application example of the invention. The liquid crystal device 100 has a color filter substrate 102, which is illustrated in, in a conceptual or three-dimensional meaning, the proximal side of the sheet of FIG. 6, which is closer to an observer. The liquid crystal device 100 further has an element substrate 101, which is illustrated in the distal side of the sheet of FIG. 6. In FIG. 6, a unit region corresponding to each of three color-component layer 6, which are made up of red (R), green (G), and blue (B), constitutes one sub pixel region SG. A set of pixel array that is made up of these three sub pixel regions SG, which has one row and three columns, constitutes one pixel region G.

An area having a plurality of the pixel regions G arrayed both in the X direction and the Y direction so as to form a matrix pattern constitutes an effective viewing area V, which is enclosed by alternate long and two short dashes lines/box (i.e., two-dot chain lines/box). Various kinds of images such as characters, numerals, graphics (i.e., figures or patterns), though not limited thereto, are displayed in the effective viewing area V. A peripheral area outside the effective viewing area V constitutes a frame area 38, which does not contribute to display.

In the formation of the liquid crystal device 100, the color filter substrate 102, which is opposed to the element substrate 101, is bonded to the element substrate 101 with the use of a frame-shaped sealant material 5 that is provided therebetween; and then, for example, a twisted nematic (TN) type liquid crystal is injected inside the region of the sealant material 5 to be sealed thereby so as to form a liquid crystal layer 4 that is sandwiched between the element substrate 101 and the color filter substrate 102.

The liquid crystal device 100 is configured as a color display device that has the above-mentioned three-colored layer 6. In addition, the liquid crystal device 100 is configured as an active matrix liquid crystal device that uses α-Si TFT elements. The liquid crystal device 100 is a transmissive display device that is operated in a transmissive mode only.

In the following description, the planar configuration of the element substrate 101 is explained. On the inner surface of a transparent substrate 101x, which is a constituent element of the element substrate 101, as its main components, a plurality of source lines 32, a plurality of gate lines 33, a plurality of α-Si TFT elements 21, a plurality of pixel electrodes 10, a driver IC 40, an external connection wiring (a plurality of lines) 35, a wiring 15, an FPC 41, though not limited thereto, are formed or mounted. The external connection wiring 35 described herein corresponds to the input terminals 92 of the mount structure 90 described above in the foregoing exemplary embodiment of the invention, whereas the plurality of source lines 32 or the plurality of gate lines 33 described herein correspond to the output terminals 93 of the mount structure 90 described above in the foregoing exemplary embodiment of the invention. A backlight, which is not shown in the drawing, is provided on the outer surface of the element substrate 101 so as to function as an illumination device.

As illustrated in FIG. 1, the transparent substrate 101x of the element substrate 101 has a protruding region 36, which protrudes outward from one end of the color filter substrate 102. The driver IC 40 is mounted on the protruding region 36 by means of an adhesive that is not shown in the drawing. The driver IC 40 described herein corresponds to the electronic component 60 of the mount structure 90 described above in the foregoing exemplary embodiment of the invention. The patterns 94 or 94x are formed on the protruding region 36 of the element substrate 101 at positions corresponding to the dummy projections 80 of the driver IC 40. The input-side terminals of the driver IC 40, which are not shown in the drawing and correspond to the input-side electrodes 70 of the mount structure 90 described above in the foregoing exemplary embodiment of the invention, are electrically connected to one ends of the plurality of external connection lines 35 that correspond to the input terminals 92 of the mount structure 90 described above, whereas the other ends of the plurality of external connection lines 35 are electrically connected to the FPC 41. One ends of the FPC 41 are connected to an electronic apparatus that will be described later.

Each of the source lines 32 described herein corresponds to the output terminal 93 of the mount structure 90 described above in the foregoing exemplary embodiment of the invention. One end of each of the source lines 32 is electrically connected to the output-side terminal of the driver IC 40, which is not shown in the drawing and corresponds to the output-side electrode 70 of the mount structure 90 described above in the foregoing exemplary embodiment of the invention. Each of the source lines 32 is configured to extend from the output side of the driver IC 40 to go over the effective viewing area V.

Each of the gate lines 33 described herein corresponds to the output terminal 93 of the mount structure 90 described above in the foregoing exemplary embodiment of the invention. Each of the gate lines 33 has a first line portion 33a that extends in the Y direction and a second line portion 33b that is bent at the end of the first line portion 33a to extend across the effective viewing area V. One end of the first line portion 33a of each of the gate lines 33 is electrically connected to the output-side terminal of the driver IC 40, which is not shown in the drawing and corresponds to the output-side electrode 70 of the mount structure 90 described above in the foregoing exemplary embodiment of the invention.

Each of the α-Si TFT elements 21 is provided in the proximity of an intersection formed by each of the source lines 32 and each of the second line portions 33b of the gate lines 33. Each of the α-Si TFT elements 21 is electrically connected to the corresponding one of the plurality of source lines 32, the plurality of gate lines 33, and the plurality of pixel electrodes 10, though not limited thereto. Each of the pixel electrodes 10 is provided inside the corresponding one of the plurality of sub pixel regions SG.

One end of the line 15 is electrically connected to a COM output-side terminal of the driver IC 40 (i.e., grounding terminal), which corresponds to the output-side electrode 70 of the mount structure 90 described above in the foregoing exemplary embodiment of the invention.

Next, the planar configuration of the color filter substrate 102 is explained below. The color filter substrate 102 is provided with a light-shielding layer, the above-mentioned three-colored layer 6, and a common electrode 8. The light-shielding layer is called as a "black matrix". In the following description, the black matrix is abbreviated as "BM".

Colored layer 6 for each of three colors is provided at a position corresponding to each of the sub pixel regions SG. BM is formed at a position corresponding to the second line portion 33b of each of the gate lines 33 and each of the α-Si TFT elements. The common electrode 8 is made of a transparent electro-conductive material such as ITO, which is also used as a material constituting each of the pixel electrodes 10. The common electrode 8 is formed inside the region of the sealant material 5 so as to cover substantially the entire surface thereof. The common electrode 8 is electrically connected to the other end of the line 15 in a region E1 on the corner of the sealant material 5.

The liquid crystal device 100 having the configuration described above operates as follows when it is driven.

Each of the source lines 32, which supply an image signal, is connected to the source electrode, which is not shown in the drawing, of the corresponding α-Si TFT element 21, whereas each of the pixel electrodes 10 is connected to the drain electrode, which is also not shown in the drawing, of the corresponding α-Si TFT element 21. In addition, each of the gate lines 33 is connected to the gate electrode, which is also not shown in the drawing, of the corresponding α-Si TFT element 21. Each of the α-Si TFT elements 21, which functions as a switching element, closes its switch for a certain time period. By this means, image signals S1, S2, . . . Sn that are supplied from the source lines 32 are written at a predetermined timing. The image signals S1, S2, . . . , and Sn may be supplied in a line-sequential manner in the order of appearance herein. Or, they may be supplied on a group-by-group basis, where the group is constituted by a plurality of gate lines 32 adjacent to each other or one another. On the other hand, the gate signals G1, G2, ..., and Gm are applied to the gate lines 33 in a line-sequential manner in the order of appearance herein at a predetermined timing like a pulse.

When the liquid crystal device 100 is driven as described above so as to perform transmissive display, illumination light that is emitted from the backlight passes through the pixel electrodes 10 and the R, G, and B colored layer 6, though not limited thereto, and is finally perceived by the observer. As the illumination light passes through the R, G, and B colored layer 6, the transmitted light has a predetermined color phase and luminance. In this way, the observer visually perceives a displayed image having desired colors.

In the liquid crystal device 100 having the basic configuration described above has the following features. The transparent substrate 101x, which is a constituent element of the element substrate 101, has transparency. The driver IC 40 corresponds to the electronic component 60 having the dummy projections 80 described above in the foregoing exemplary embodiment of the invention. The input-side terminals of the driver IC 40, which are not shown in the drawing and correspond to the input-side electrodes 70 of the mount structure 90 described above in the foregoing exemplary embodiment of the invention, are electrically connected to one ends of the plurality of external connection lines 35 that correspond to the input terminals 92 of the mount structure 90 described above. The output-side terminal of the driver IC 40, which is not shown in the drawing and corresponds to the output-side electrode 70 of the mount structure 90 described above in the foregoing exemplary embodiment of the invention is electrically connected to a wiring including each of the source lines 32, each of the gate lines 33, and the line 15, where the wiring corresponds to the output terminals 93 of the mount structure 90 described above. The patterns 94 or 94x are formed on the protruding region 36 of the transparent substrate 101x of the element substrate 101 at positions corresponding to the dummy projections 80 of the driver IC 40. With such a configuration, the liquid crystal device 100 offers the same advantageous effects as those of the mount structure 90 described above.

Electronic Apparatus

Next, with reference to FIG. 7, two specific examples of an electronic apparatus having the liquid crystal device 100 according to the foregoing exemplary embodiments of the invention are described below.

As a first example thereof, an explanation is given below of an exemplary implementation of the invention where the liquid crystal device 100 according to the foregoing exemplary embodiments of the invention is configured as the display unit of a portable/mobile personal computer (e.g., notebook-sized personal computer). FIG. 7A is a perspective view that schematically illustrates an example of the configuration of a mobile personal computer. As illustrated in the drawing, a personal computer 710 is made up of a computer main assembly 712, which is provided with a keyboard 711, and a display unit 713 to which the liquid crystal device 100 according to the foregoing exemplary embodiments of the invention is applied.

As a second example thereof, an explanation is given below of another exemplary implementation of the invention where the liquid crystal device 100 according to the foregoing exemplary embodiments of the invention is configured as the display unit of a mobile phone. FIG. 7B is a perspective view that schematically illustrates an example of the configuration of a mobile phone. As illustrated in the drawing, the mobile phone 720 is provided with a plurality of manual operation buttons 721, an earpiece 722, a mouthpiece 723, and a display unit 724 to which the liquid crystal device 100 according to the foregoing exemplary embodiments of the invention is applied.

Figure 7A:
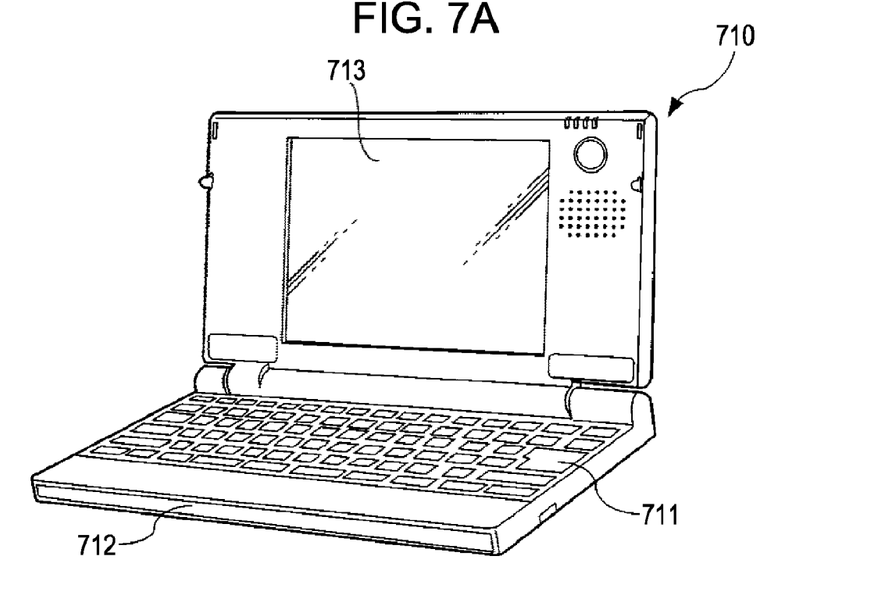
FIGS. 7A and 7B is a set of diagrams that schematically illustrates two specific examples of an electronic apparatus that is provided with the liquid crystal device according to the exemplary embodiment of the invention.
Figure 7B:
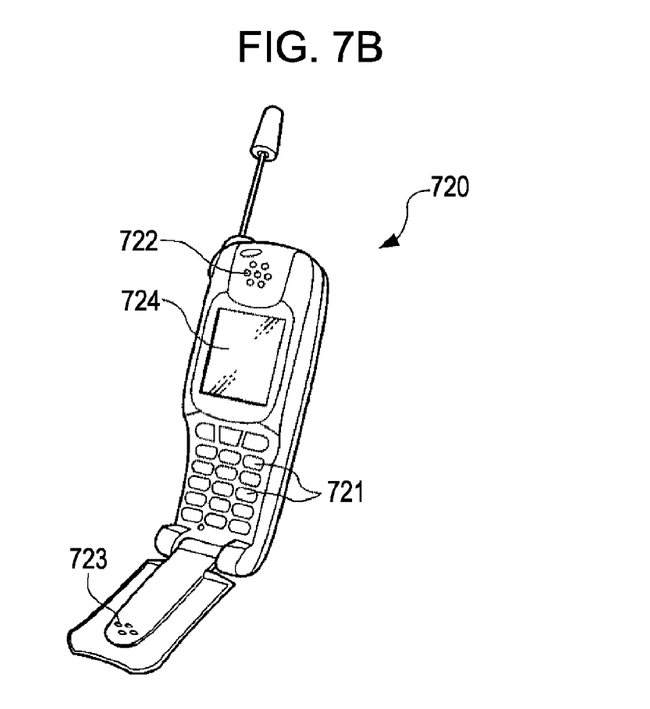

Among a variety of electronic apparatuses to which the liquid crystal device 100 according to the foregoing exemplary embodiments of the invention is applicable are, other than the personal computer illustrated in FIG. 7A and the mobile phone illustrated in FIG. 7B, a liquid crystal television, a video tape recorder of a viewfinder type or a direct monitor view type, a car navigation device, a pager, an electronic personal organizer, an electronic calculator, a word processor, a workstation, a videophone, a POS terminal, a digital still camera, and so forth.

The entire disclosure of Japanese Patent Application No. 2007-013487, field Jan. 24, 2007 is expressly incorporated by reference herein.

What is claimed is:

1. A mount structure comprising:
    an electronic component having a base substance and protruded electrodes provided on a surface of the base substance, each of the protruded electrodes having an electrode pad, a projection having elasticity, and an electro-conductive film that is formed to extend from a surface of the electrode pad to go over a surface of the projection;
    a transparent substrate for mounting the electronic component thereon, the transparent substrate having terminals that are electrically connected to the electro-conductive films;
    at least one dummy projections each of which is provided on the surface of the base substance; and
    at least one patterns each of which is formed at a position corresponding to the dummy projection on a surface of the transparent substrate,
    wherein each of the dummy projections becomes elastically deformed by a certain deformation amount when the electronic component is mounted on the transparent substrate, the deformation amount thereof having a certain predetermined deformation ratio relative to the amount of deformation of each of the protruded electrodes, which also becomes elastically deformed due to pressure applied by the electronic component onto the surface of the transparent substrate; and
    each of the patterns is used for checking the amount of elastic deformation of the corresponding dummy projection when making observation through a reverse face of the transparent substrate that is opposite the above-mentioned surface thereof.

2. The mount structure according to claim 1, wherein each of the dummy projections has a projection having elasticity and an electro-conductive film that goes over, at least, a surface of the projection.

3. The mount structure according to claim 2,
    wherein each of the projections of the dummy projections is made of the same material as that of each of the projections of the protruded electrodes; and
    each of the electro-conductive films of the dummy projections is made of the same material as that of each of the electro-conductive films of the protruded electrodes.

4. The mount structure according to claim 1,
    wherein the base substance of the electronic component has the shape of a substantially rectangular parallelepiped;
    the protruded electrodes are arrayed along each of two sides that are opposed to each other on the surface of the base substance; and the dummy projections are provided at positions close to the protruded electrodes that are arrayed in at least one line along each of the above-mentioned two sides that are opposed to each other on the surface of the base substance, the dummy projections being provided in the proximity of both of the ends and the center of each of the above-mentioned two sides.

5. The mount structure according to claim 1,
wherein each of the dummy projections and each of the protruded electrodes has the shape of a hemisphere;
each of the patterns is made up of the plurality of concentric ring-shaped sub-patterns;
each of the ring-shaped sub-patterns functions as a deformation amount check mark that can be used for checking the amount of deformation of the corresponding dummy projection, and
when each of the patterns and the corresponding dummy projection are viewed from the reverse face of the transparent substrate, the positional relationship between the ring-shaped sub-patterns and the external circumferential form of the corresponding dummy projection that has been elastically deformed at the time of the mounting of the electronic component on the transparent substrate is observed, whereby making it possible to check the amount of deformation of each of the dummy projections.

6. The mount structure according to claim 1, wherein each of the patterns has a gradation sub-pattern that has gradations formed in equal pitch, which is incremented outward from the center of the pattern.

7. The mount structure according to claim 1, wherein the center of each of the patterns functions as an alignment mark that can be used for performing positional alignment between the center of the pattern and the center of the dummy projection at the time of mounting the electronic component on the surface of the transparent substrate.

8. The mount structure according to claim 1, wherein each of the dummy projections is not electrically conductive with the corresponding pattern.

9. The mount structure according to claim 1, wherein each of the patterns is made of the same electrically conductive material as that of the terminal.

10. An electro-optical device having the mount structure according to claim 1.

11. An electronic apparatus that is provided with the electro-optical device according to claim 10, the electro-optical device functioning as a display section of the electronic apparatus.

* * * * *